(12) United States Patent
Urata

(10) Patent No.: US 11,528,009 B2
(45) Date of Patent: Dec. 13, 2022

(54) ACOUSTIC WAVE FILTER, MULTIPLEXER, AND COMMUNICATION APPARATUS

(71) Applicant: KYOCERA Corporation, Kyoto (JP)

(72) Inventor: Tomonori Urata, Kyotanabe (JP)

(73) Assignee: KYOCERA Corporation, Kyoto (JP)

( * ) Notice: Subject to any disclaimer, the term of this patent is extended or adjusted under 35 U.S.C. 154(b) by 161 days.

(21) Appl. No.: 16/768,552

(22) PCT Filed: Nov. 22, 2018

(86) PCT No.: PCT/JP2018/043230
§ 371 (c)(1),
(2) Date: May 29, 2020

(87) PCT Pub. No.: WO2019/107280
PCT Pub. Date: Jun. 6, 2019

(65) Prior Publication Data
US 2020/0295734 A1    Sep. 17, 2020

(30) Foreign Application Priority Data

Dec. 1, 2017  (JP) .............................. JP2017-231971

(51) Int. Cl.
| H03H 9/64 | (2006.01) |
| H03H 9/10 | (2006.01) |
| H03H 9/25 | (2006.01) |
| H03H 9/54 | (2006.01) |
| H03H 9/72 | (2006.01) |
| H04B 1/00 | (2006.01) |

(52) U.S. Cl.
CPC ........ *H03H 9/6483* (2013.01); *H03H 9/1071* (2013.01); *H03H 9/25* (2013.01); *H03H 9/542* (2013.01); *H03H 9/725* (2013.01); *H04B 1/0057* (2013.01)

(58) Field of Classification Search
CPC .. H03H 9/64; H03H 9/72; H03H 9/54; H03H 9/70
USPC ......................................................... 333/193
See application file for complete search history.

(56) References Cited

U.S. PATENT DOCUMENTS

| 7,459,992 B2 * | 12/2008 | Matsuda ................ H03H 9/725 333/133 |
| 8,581,674 B2 * | 11/2013 | Tanaka ................ H03H 9/6436 333/133 |
| 2004/0075362 A1 | 4/2004 | Inoue et al. |
| 2004/0227585 A1 | 11/2004 | Taniguchi et al. |
| 2011/0018653 A1 | 1/2011 | Bradley et al. |

(Continued)

FOREIGN PATENT DOCUMENTS

| JP | H04-114505 A | 4/1992 |
| JP | 2000-077967 A | 3/2000 |

(Continued)

*Primary Examiner* — Hafizur Rahman
(74) *Attorney, Agent, or Firm* — Procopio Cory Hargreaves and Savitch LLP

(57) ABSTRACT

An acoustic wave filter includes a first signal terminal, an antenna terminal, a ladder-type filter connected between the first signal terminal and the antenna terminal and including one or more serial resonators and one or more parallel resonators connected in a ladder shape, and a capacitor part and an inductor part which are connected in series between the first signal terminal and a reference potential.

17 Claims, 12 Drawing Sheets

(56) References Cited

U.S. PATENT DOCUMENTS

| | | |
|---|---|---|
| 2013/0021116 A1 | 1/2013 | Sogoya et al. |
| 2016/0173061 A1* | 6/2016 | Takamine ............ H03H 9/6433 |
| | | 333/133 |
| 2017/0163242 A1* | 6/2017 | Miyamoto ............. H03H 9/542 |
| 2017/0359051 A1 | 12/2017 | Urata |
| 2018/0302061 A1 | 10/2018 | Sugaya |

FOREIGN PATENT DOCUMENTS

| | | |
|---|---|---|
| JP | 2004-289195 A | 10/2004 |
| JP | 2008-245310 A | 10/2008 |
| WO | 2011/142143 A1 | 11/2011 |
| WO | 2016/104598 A1 | 6/2016 |
| WO | 2017/110993 A1 | 6/2017 |

\* cited by examiner

PASSING BAND

ISOLATION

ATTENUATION IN VICINITY

PASSING BAND

ISOLATION

ATTENUATION IN VICINITY

ACOUSTIC WAVE FILTER, MULTIPLEXER, AND COMMUNICATION APPARATUS

TECHNICAL FIELD

The present disclosure relates to an acoustic wave filter filtering signals by utilizing an acoustic wave, a multiplexer including the acoustic wave filter, and a communication apparatus. The acoustic wave is for example a surface acoustic wave (SAW).

BACKGROUND ART

As an acoustic wave filter, there is known a ladder-type filter in which a plurality of acoustic wave resonators are connected in a ladder shape (Japanese Patent Publication No. 2008-245310A). An acoustic wave resonator for example includes a piezoelectric substrate and an IDT (interdigitated transducer) electrode positioned on the piezoelectric substrate.

Japanese Patent Publication No. 2008-245310A discloses a multiplexer which has a ladder-type filter as a transmission filter. The transmission filter filters an input transmission signal and outputs the result to an antenna terminal. In the multiplexer, it is necessary to raise isolation between the transmission filter and a receiving filter. Note that, the multiplexer in Japanese Patent Publication No. 2008-245310A has a low pass filter in a latter stage (antenna terminal side) in the transmission filter. The capacitor in the low pass filter is configured by an IDT electrode positioned on the piezoelectric substrate.

SUMMARY OF INVENTION

It is desired to provide an acoustic wave filter capable of improving an out-of-band attenuation characteristic and provide a multiplexer and communication apparatus excellent in isolation characteristics by using the acoustic wave filter.

Solution to Problem

An acoustic wave filter according to one aspect of the present disclosure includes a first signal terminal, an antenna terminal, a ladder-type filter which is connected between the first signal terminal and the antenna terminal, and a capacitor part and an inductor part which are connected in series between a position between the ladder-type filter and the first signal terminal and a reference potential.

A multiplexer according to one aspect of the present disclosure includes the acoustic wave filter described above, a second signal terminal, and a passband filter which is connected between the second signal terminal and the antenna terminal.

A communication apparatus according to one aspect of the present disclosure includes the multiplexer described above and an antenna connected to the antenna terminal.

According to the above configurations, an acoustic wave filter, a multiplexer, and a communication apparatus which are excellent in attenuation characteristics can be provided.

DESCRIPTION OF EMBODIMENTS

Figure 1:
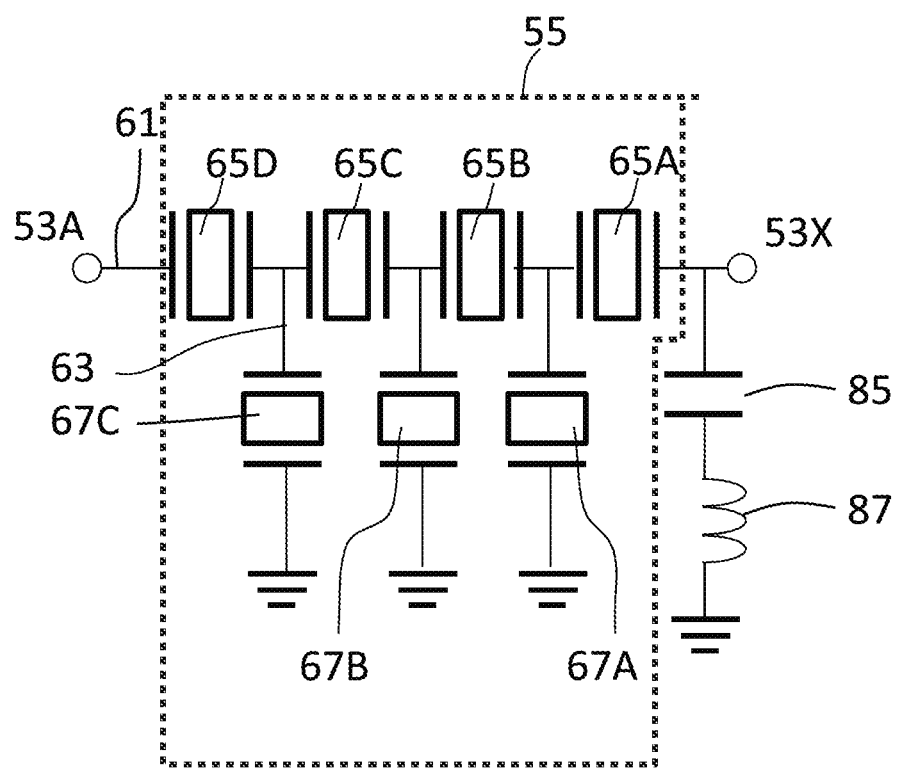
FIG. 1 is a schematic circuit diagram showing a configuration of an acoustic wave filter.

Below, an embodiment of the present disclosure will be explained with reference to the drawings. Note that, the drawings used in the following explanation are schematic ones. Size ratios etc. in the drawings do not always coincide with the actual ones.

The same or similar configurations will be sometimes named with different letters attached to the same terms, such as a "first comb-shaped electrode 11A" and "second comb-shaped electrode 11B". Further, in this case, sometimes they will be simply referred to as the "comb-shaped electrodes 11" and not be differentiated.

(Acoustic Wave Filter)

FIG. 1 is a schematic circuit diagram showing the configuration of an acoustic wave filter 51 according to an embodiment. In this example, as will be explained later, a case using a SAW among acoustic waves will be shown. For this reason, below, sometimes the acoustic wave filter 51 will be shown as a "SAW filter 51".

The SAW filter 51 is provided with an antenna terminal 53A, a first signal terminal 53X, a ladder-type filter 55, a capacitor part 85, and an inductor part 87.

The ladder-type filter 55 is connected between the antenna terminal 53A and the first signal terminal 53X. Between them are provided serially connected serial resonators 65 (65A to 65D in this example) and parallel resonators 67 (67A to 67C in this example) which are respectively provided in parallel arms 63 connecting a serial arm 61 connecting the serial resonators 65 and reference potentials.

The capacitor part 85 and inductor part 87 are positioned in the middle of a route connecting the first signal terminal 53X and the reference potential. These capacitor part 85 and inductor part 87 are arranged in series relative to each other in this route. From another viewpoint, the capacitor part 85 and inductor part 87 are positioned closer to the first signal terminal 53X side than the initial stage of the ladder-type filter 55. That is, the capacitor part 85 and the inductor part 87 are connected to a position between the ladder-type filter 55 and the first signal terminal 53X like a shunt.

As explained above, by the provision of the capacitor part 85 and inductor part 87, an LC serial resonance circuit is connected to a signal line (serial arm 61) connecting the first signal terminal 53X and the antenna terminal 53A like a shunt, therefore a resonance frequency caused by the LC serial resonance circuit can be positioned at a desired position. As a result, an attenuation characteristic of the SAW filter 51 can be improved. Note that, the serial resonators 65 and parallel resonators 67 require the selection of the optimum capacitance values for realizing the filter characteristics. On the other hand, the capacitor part 85 does not directly contribute to formation of the passing band of the ladder-type filter by the SAW resonance. For this reason, the capacitance value can be set to any value, therefore the resonance frequency can be precisely controlled by the capacitor part 85 and inductor part 87.

Further, by providing the LC serial resonance circuit between the antenna terminal 53A and the first signal terminal 53X, a state matching with the ladder-type filter 55 can be exhibited, therefore loss of the ladder-type filter 55 can be reduced compared with a case where a usual external circuit is added.

Further, in a device having a circuit configuration in which a plurality of filters are connected by a common terminal, there is a possibility that loss in a capacitor part or inductor part formed at the position closest to the common terminal in each filter will worsen the losses of the other filters through the common terminal. Contrary to this, according to the SAW filter 51 shown in FIG. 1, by connecting the capacitor part 85 and inductor part 87 to not the antenna terminal 53A side, but the first signal terminal 53X side, insertion losses of the other filters will not be worsened through the antenna. Further, the possibility of occurrence of mismatch of impedances between the antenna connected to the antenna terminal 53A and the other filters can be reduced.

Further, by connection of the capacitor part 85 and the inductor part 87 like a shunt, they function also as a route for discharge of heat generated in the ladder-type filter 55, therefore an electrical power resistance can be raised. In particular, when the ladder-type filter 55 functions as the transmission filter, the electrical power resistance can be raised by providing a route connected to the reference potential on the first signal terminal 53X side having the highest signal strength. Further, by adding an external impedance matching circuit, a low pass filter including the capacitor part 85 can be configured. For example, when adding the inductor in series, this becomes an L-type low pass filter including the capacitor part 85. By further adding a capacitor like a shunt, a n-type low pass filter including the capacitor part 85 can be configured. By increasing the number of elements, this becomes a low pass filter which is steeper and has a larger attenuation amount. By combination with the capacitor part 85, an increase of the number of external elements can be suppressed as well. Further, when the capacitor part 85 is given the same structure as the resonator configuring the ladder-type filter, if a SAW resonator, it is possible to finely adjust the capacitance value by changing the number and line width of the comb-shaped electrodes, frequency pitch, intersecting width, and the like, therefore it becomes possible to set constants of the low pass filter in detail.

The capacitor part 85 may be a pair of electrode patterns which are arranged so as to face each other at an interval on the substrate, may be an interdigital capacitor formed by an electrode pattern comprised of a pair of comb-shaped electrodes arranged so as to intermesh with each other on the substrate in the same way, or may be an electrode pattern which is formed stacked through a dielectric layer in the thickness direction on the substrate.

In the LC serial resonance circuit, the resonance frequency greatly fluctuates even by a very small change of the capacitance. For this reason, by forming the capacitor part 85 with such electrode patterns, a desired capacitance can be finely realized, therefore a desired attenuation characteristic can be obtained. Note that, when the capacitor part 85 is formed by an interdigital capacitor on a substrate having a piezoelectric characteristic, the interval of the comb teeth may be suitably adjusted so that the resonance frequency of the capacitor part 85 becomes out of the passband of the ladder-type filter 55 as well.

The inductor part 87 may be formed with fine conductor patterns as well. In this case, it may be formed on the same component member as that for the capacitor part 85 or may be formed on another member.

Figure 2:
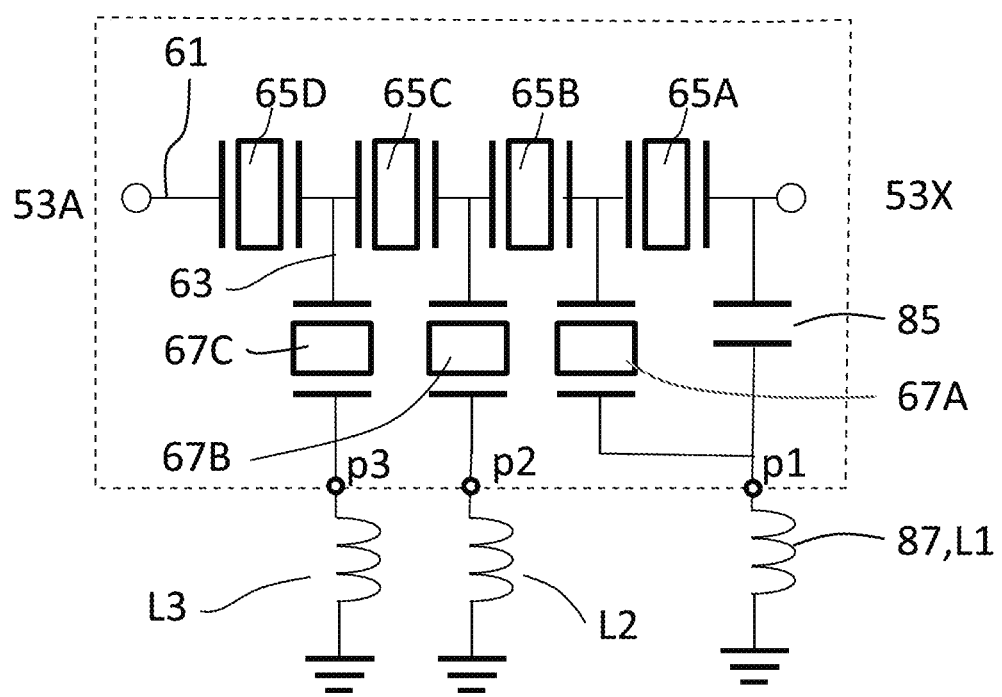
FIG. 2 is a schematic circuit diagram showing a configuration of an acoustic wave filter.

In the example explained above, the explanation was given by taking as an example the case where the inductor part 87 was connected to only the capacitor part 85. However, the SAW filter is not limited to this. FIG. 2 shows a modification of the SAW filter 51 shown in FIG. 1.

In FIG. 2, inductors $L_i$ to $L3$ are connected between the parallel resonators 67 and the reference potentials. Due to the provision of such inductors L, the resonance frequencies of the parallel resonators connected with the inductors fall. Due to this, the interval between the resonance frequency and the antiresonance frequency expands, therefore the passing band of the filter can be extended.

Here, in FIG. 2, the capacitor part 85 is connected to the inductor $L1$ which is connected to the first parallel resonator 67A. That is, the first parallel resonator 67A and the capacitor part 85 are connected in parallel when viewed from the inductor $L1$. In this case, the inductor $L1$ functions as an inductor component extending the bandwidth and functions also as an inductor component used as the LC serial resonance circuit. That is, the inductor $L1$ becomes the inductor part 87.

By making the inductor $L1$ function also as the inductor part 87 in this way, the number of inductors can be decreased, therefore the SAW filter 51 can be reduced in size. Further, by connection in this way, a resonance point is manifested at a plurality of frequencies. Therefore, by setting the capacitance value of the capacitor part 85 and the inductance value of the inductor part at the optimum values and controlling the resonance frequency, the attenuation characteristic can be improved in a broader band.

In this case, the inductance of the inductor part 87 has the function of extension of the bandwidth, therefore a certain size or more becomes necessary. Therefore, in order to obtain a greater effect of improvement of attenuation characteristic in a desired frequency band in accordance with that, the capacity of the capacitor part 85 must be made smaller. For this reason, the capacitance in the capacitor part 85 becomes a much smaller value compared with static capacitances of the serial resonators 65 and parallel resonators 67. For example, it becomes a capacitance value not more than 1/5.

Specifically, for example, when applying the SAW filter in the present disclosure to a filter of the 2 GHz band, the inductance in the inductor part 87 is approximately 1 to 3 nH, and the capacitance in the capacitor part 85 is approximately 0.2 pF or less, therefore the capacitance value becomes about 1/10 of that of the resonator having the smallest static capacitance among the serial resonators 65 and parallel resonators 67.

Note that, in the example shown in FIG. 2, an explanation was given by taking as an example the case where the inductors L were respectively serially connected to all parallel resonators 67. However, the SAW filter is not limited to this. The inductors L may be provided only for some of the parallel resonators 67 as well.

Further, in the example shown in FIG. 2, the inductor L connected with the capacitor part 85 is not limited to the inductor L1 connected to the first parallel resonator 67A. For example, it may be the inductor L2 which is connected to the second parallel resonator 67B as well.

(Specific Configuration)

Next, specific configurations realizing the SAW filters 51 shown in FIG. 1 and FIG. 2 explained above will be explained.

(Configuration of SAW Resonator)

Figure 3:
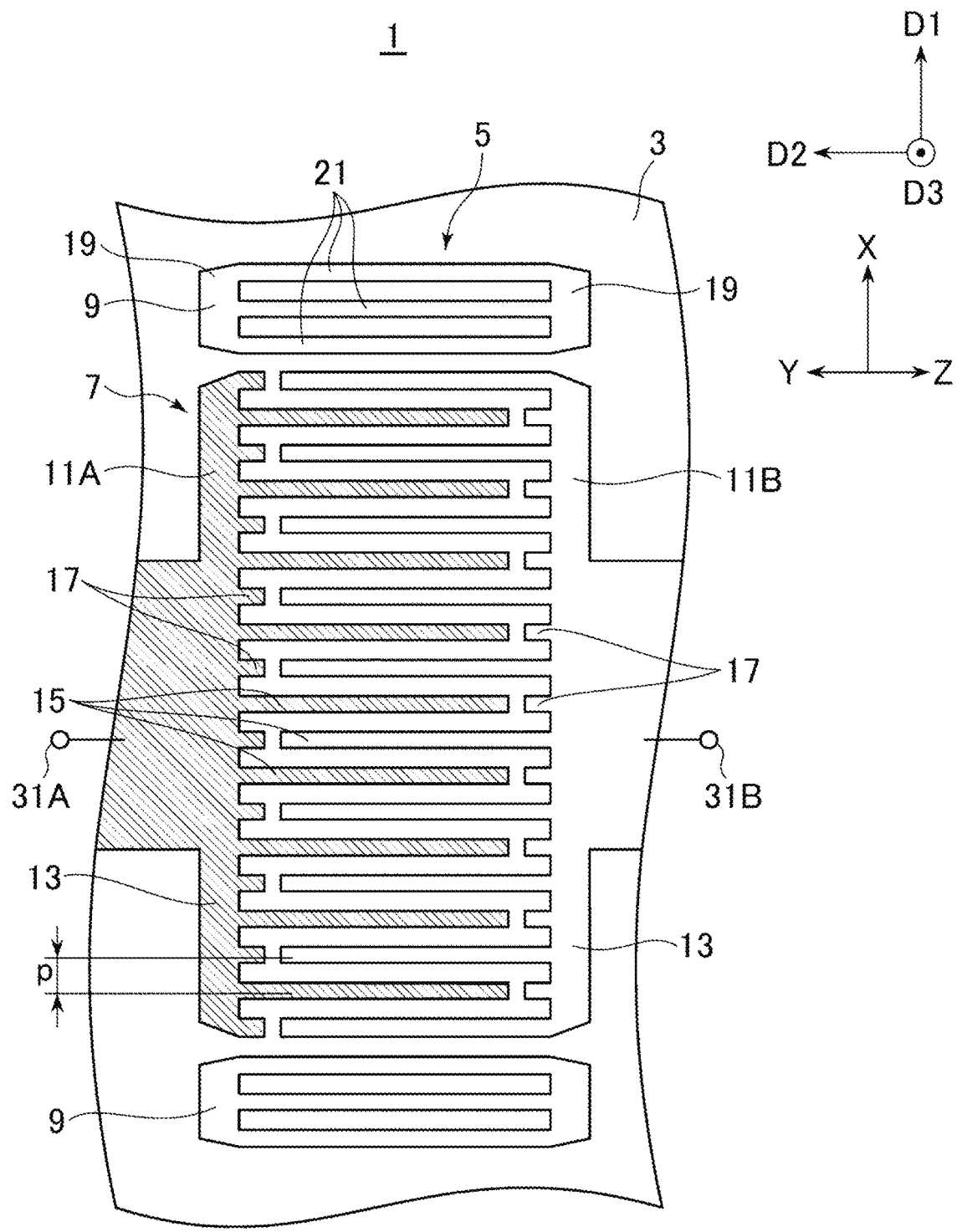
FIG. 3 is a plan view showing a configuration of a SAW resonator.

FIG. 3 is a plan view showing the configuration of a SAW resonator 1 used in the SAW filter 51 according to the embodiment.

In the SAW resonator 1 (SAW filter 51), any direction may be defined as "above" or "below. In the following description, however, for convenience, an orthogonal coordinate system comprised of a D1 axis, D2 axis, and D3 axis will be defined, and the "upper surface" and other terms will be used where the positive side of the D3 axis (front side on the drawing sheet in FIG. 1) is the upper part. Note that, the D1 axis is defined so as to be parallel to the direction of propagation of a SAW propagating along the upper surface of the piezoelectric substrate 3 which will be explained later (the surface on the front side on the drawing sheet, usually the broadest surface (major surface)), the D2 axis is defined so as to be parallel to the upper surface of the piezoelectric substrate 3 and perpendicular to the D1 axis, and the D3 axis is defined so as to be perpendicular to the upper surface of the piezoelectric substrate 3.

The SAW resonator 1 configures a so-called 1-port SAW resonator. For example, it generates resonance when receiving as input an electrical signal having a predetermined frequency from one of the schematically shown first terminal 31A and second terminal 31B and outputs the signal where resonance occurs from the other of the first terminal 31A and second terminal 31B.

Such a SAW resonator 1 for example has a piezoelectric substrate 3 and a resonator electrode part 5 provided on the piezoelectric substrate 3. The resonator electrode part 5 has an IDT electrode 7 and a pair of reflectors 9 which are positioned on the two sides of the IDT electrode 7.

The piezoelectric substrate 3 is for example configured by a single crystal having a piezoelectric characteristic. The single crystal is for example a lithium niobate (LN: $LiNbO_3$) single crystal or lithium tantalate (LT: $LiTaO_3$) single crystal. The cut angle may be suitably set in accordance with the type of the SAW which is utilized and the like. For example, as the piezoelectric substrate 3, use can be made of a rotated Y-cut and X-propagating one. That is, the X-axis is parallel to the upper surface (D1 axis) of the piezoelectric substrate 3, and the Y-axis is inclined relative to the normal line of the upper surface of the piezoelectric substrate 3 at a predetermined angle. Note that, the piezoelectric substrate 3 may be one which is formed relatively thin and to which a support substrate made of an inorganic material or organic material is directly or indirectly attached on the back surface (surface on the negative side of the D3 axis) as well.

The IDT electrode 7 and reflectors 9 are configured by layer-shaped conductors which are provided on the piezoelectric substrate 3. The IDT electrode 7 and reflectors 9 are for example configured by mutually the same materials to mutually the same thicknesses. The layer-shaped conductors configuring them are for example metal. The metal is for example Al or an alloy containing Al as the principal ingredient (Al alloy). The Al alloy is for example an Al—Cu alloy. The layer-shaped conductor may be configured by a plurality of metal layers as well. The thickness of the layer-shaped conductor is suitably set in accordance with the electrical characteristics and high frequency characteristic etc. demanded from the SAW resonator 1. As one example, the thickness of the layer-shaped conductor is 50 nm to 600 nm.

The IDT electrode 7 has a first comb-shaped electrode 11A (hatching attached for convenience in order to improve the visibility) and a second comb-shaped electrode 11B. Each comb-shaped electrode 11 has a bus bar 13, a plurality of electrode fingers 15 which extend alongside each other from the bus bar 13, and a plurality of dummy electrodes 17 which project from the bus bar 13 between two or more electrode fingers 15. The pair of comb-shaped electrodes 11 are arranged so that the pluralities of electrode fingers 15 intermesh (intersect) with each other. That is, the two bus bars 13 in the pair of comb-shaped electrodes 11 are arranged so as to face each other, and the electrode fingers 15 in the first comb-shaped electrode 11A and the electrode fingers 15 in the second comb-shaped electrode 11B are basically alternately arranged in the width direction thereof. Further, the tip ends of the plurality of dummy electrodes in one comb-shaped electrode 11 face the tip ends of the electrode fingers 15 in the other comb-shaped electrode 11.

The bus bars 13 are formed in long shapes so as to linearly extend in the direction of propagation of the SAW (D1 axis direction) in this example. However, they may be inclined relative to the direction of propagation of the SAW as well.

Each electrode finger 15 is for example substantially formed in a long shape so as to linearly extend in a direction (D2 axis direction) perpendicular to the direction of propagation of the SAW with a constant width. The pluralities of electrode fingers 15 are for example arranged in the direction of propagation of the SAW. Further, they have equal lengths as each other. Note that, the IDT electrode 7 may be so-called apodized so that the lengths of the pluralities of electrode fingers 15 (from another viewpoint, the intersecting widths) change in accordance with the position in the direction of propagation as well.

The number of the electrode fingers 15 may be suitably set in accordance with the electrical characteristics etc. demanded from the SAW resonator 1. Note that, FIG. 1 etc. are schematic views, therefore a smaller number of electrode fingers 15 are shown. In actuality, a larger number of (for example 100 or more) electrode fingers 15 than the shown ones may be arranged. The same is true for the strip electrodes 21 in the reflectors 9 which will be explained later.

A pitch "p" of the plurality of electrode fingers 15 (electrode finger pitch) is for example made substantially constant over the entire IDT electrode 7. Note that, the pitch "p" is for example a distance between the centers of two mutually neighboring electrode fingers 15 (or strip electrodes 21 which will be explained later). The pitch "p" is basically made a half of a wavelength "λ" (p=λ/2) of the SAW having an equal frequency to the frequency at which resonance is intended among SAWs propagating on the piezoelectric substrate 3.

The pluralities of dummy electrodes 17 are for example substantially formed in long shapes so as to linearly project in a direction (D2 axis direction) perpendicular to the direction of propagation of the SAW with constant widths. The gaps between the tip ends of them and the tip ends of the pluralities of electrode fingers 15 are for example equal among the pluralities of dummy electrodes 17. The IDT electrode 7 may be once without any dummy electrode 17 as well. In the following explanation, sometimes explanation and illustration of the dummy electrodes 17 will be omitted.

The reflector 9 is for example formed in a lattice shape. That is, the reflector 9 has a pair of bus bars 19 which face each other and a plurality of strip electrodes 21 which extend between the pair of bus bars 19.

The shapes of the bus bars 19 and strip electrodes 21 may be made equal to those of the bus bars 13 and electrode fingers 15 in the IDT electrode 7 except that the two ends of the strip electrode 21 are connected to the pair of bus bars 19.

The number of the plurality of strip electrodes 21 is for example set so that the reflectivity of the SAW in a mode intending use becomes substantially 100% or more. The theoretically required smallest number thereof is for example several to 10 or so. Usually, the number is made 20 or more or 30 or more with a safety margin.

The pair of reflectors 9 are for example adjacent to the two sides of the IDT electrode 7 in the direction of propagation of the SAW. Accordingly, the pluralities of strip electrodes 21 are arranged continuing from the arrangement of the pluralities of electrode fingers 15.

Note that, the upper surface of the piezoelectric substrate 3 may be covered by a protective film 23 (FIG. 7) made of $SiO_2$ or the like from the tops of the IDT electrode 7 and reflectors 9 as well. Further, in a case where the protective film 23 is provided or the like, additional films made of insulator or metal may be provided on the upper surfaces or lower surfaces of the IDT electrode 7 and reflectors 9 in order to improve the reflection coefficient of the SAW as well.

When a voltage is supplied to the pair of comb-shaped electrodes 11, the voltage is supplied to the piezoelectric substrate 3 by the electrode fingers 15, and a SAW in a predetermined mode propagating in the D1 axis direction along the upper surface is excited in the vicinity of the upper surface of the piezoelectric substrate 3. The excited SAW is mechanically reflected by the electrode fingers 15. As a result, a standing wave having the pitch of the electrode fingers 15 as a half wavelength is formed. The standing wave is converted to an electrical signal having the same frequency as that of the standing wave and is extracted by the electrode fingers 15. The SAW resonator 1 functions as a resonator in this way.

The SAW excited in the IDT electrode 7 is mechanically reflected by the strip electrodes 21 in the reflectors 9. Further, the mutually neighboring strip electrodes 21 are connected to each other by the bus bars 19, therefore the SAW from the IDT electrode 7 is reflected by the strip electrodes 21 electrically as well. Due to this, dispersion of the SAW is suppressed and a strong standing wave stands in the IDT electrode 7, therefore the function of the SAW resonator 1 as a resonator is improved.

Note that, when the "connection" is mentioned with respect to the SAW resonator 1 (or additional resonator 57 which will be explained later), the "connection" means connection in a mode where voltage is supplied to the pair of comb-shaped electrodes 11 unless particularly explained otherwise, as schematically shown by the first terminal 31A and second terminal 31B.

(Configuration of SAW Filter)

Figure 4:
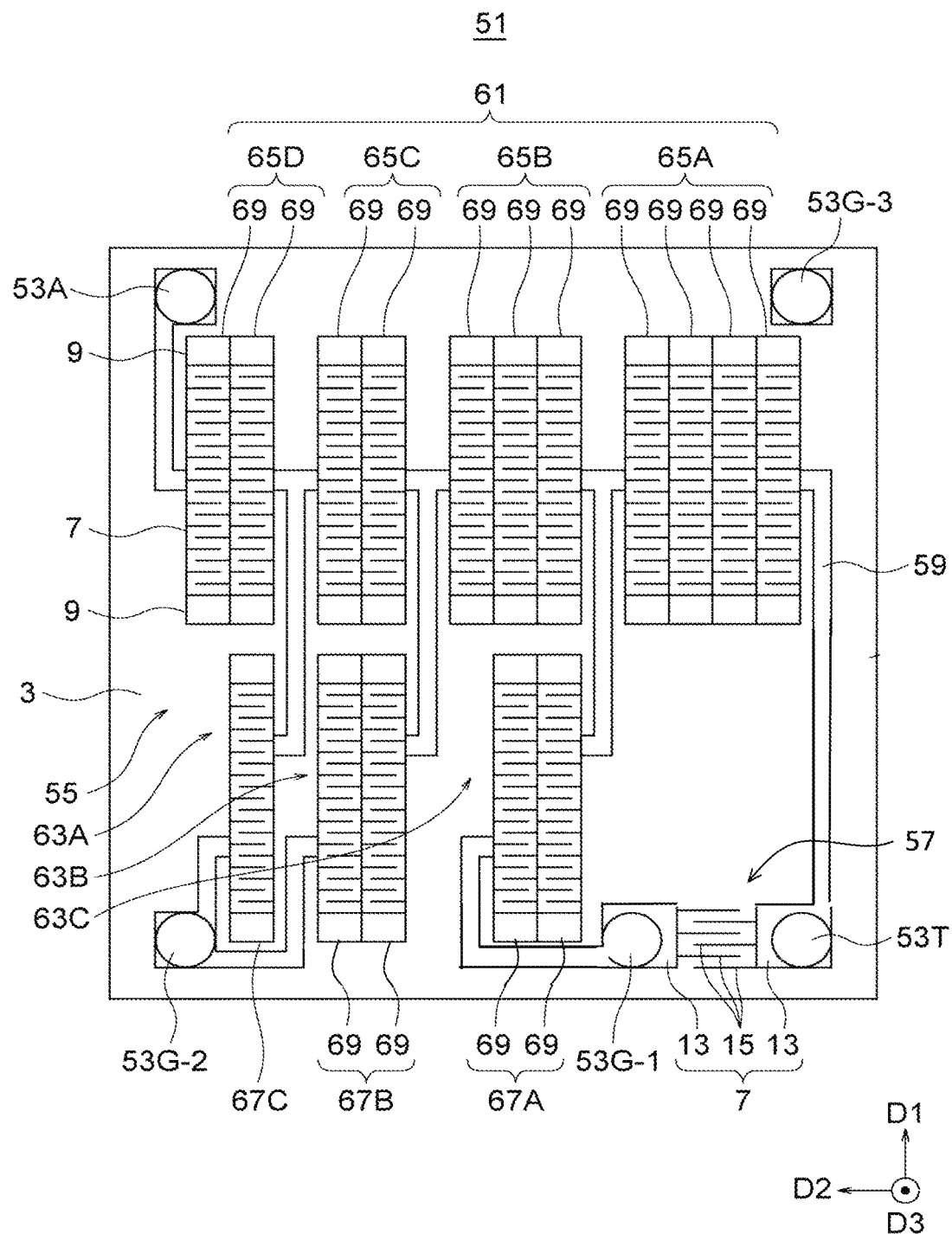
FIG. 4 is a plan view schematically showing a configuration of a SAW filter including the SAW resonator in FIG. 3.

FIG. 4 is a plan view schematically showing the configuration of a region surrounded by a broken line in FIG. 2 in the SAW filter 51 including the SAW resonator 1. In this view, as will be understood from notations of the IDT electrode 7 and reflectors 9 shown on the top left side in the drawing, these conductors are further more schematically shown than those in FIG. 3.

The SAW filter 51 includes a ladder-type filter 55 in which the SAW resonators 1 are connected in a ladder shape. Further, the SAW filter 51 including the ladder-type filter 55 may be for example configured as a filter filtering the signal to be transmitted in wireless communications as well. In the following example, the explanation will be given by taking as an example a case where the SAW filter 51 is applied to the transmission filter.

The SAW filter 51 has the already explained piezoelectric substrate 3. Further, on the piezoelectric substrate 3, the SAW filter 51 has a transmission terminal 53T (first signal terminal 53X), antenna terminal 53A and GND terminals 53G-1 to 53G-3, ladder-type filter 55, additional resonator 57 configuring the capacitor part 85, and wirings 59.

Note that, in the following description, sometimes the GND terminals 53G-1 to 53G-3 will not be differentiated and will be simply referred to as the "GND terminals 53G". Further, sometimes the transmission terminal 53T, antenna terminal 53A, and GND terminals 53G will not be differentiated and will be simply referred to as the "terminals 53".

The transmission terminal 53T is for example a terminal which is connected to a circuit generating a transmission signal. The antenna terminal 53A is a terminal connected to the antenna. The GND terminal 53G is a terminal given a reference potential (grounded). The ladder-type filter 55 filters the signal input to the transmission terminal 53T and outputs the result to the antenna terminal 53A. At this time, the unwanted component (signal out of the passing band) is made flow to the GND terminals 53G. The additional resonator 57 for example contributes to protection of the transmission filter 55 from heat.

The terminals 53 and wirings 59 are configured by layer-shaped conductors which are positioned on the upper surface of the piezoelectric substrate 3. The specific numbers, shapes, sizes, and positions of them may be suitably set. The terminals 53 and wirings 59 are for example configured by mutually the same conductor layers (materials and thicknesses are the same as each other). However, at the position of the terminal 53, a conductor layer made of another material may be formed on the conductor layer common to the terminal 53 and wiring 59 as well. Naturally, the terminal 53 and the wiring 59 may be configured by mutually different materials as well.

Note that, the terminal 53 need not be one able to be differentiated from the wiring 59 by its configuration (shape or material etc.). The terminal 53 may be one like a portion of the wiring 59. For example, the position or range of the terminal 53 may be determined by an insulation layer (for example protective film 23) which covers the wiring 59 but does not cover the terminal 53 or may be determined by a member (for example bump) abutting against the terminal 53 when the piezoelectric substrate 3 is packaged.

(Configuration of Transmission Filter)

The ladder-type filter 55 has a serial arm 61 and one or more parallel arms 63 (first parallel arm 63A to third parallel arm 63C in the example shown). The serial arm 61 connects the transmission terminal 53T and the antenna terminal 53A and contributes to transmission of signals in the passing band. The parallel arms connect the serial arm 61 and the GND terminals 53G and contribute to the flow of signals out of the passing band to the GND terminals 53G.

The serial arm 61 includes a plurality of serial resonators 65 which are connected in series between the transmission terminal 53T and the antenna terminal 53A. Note that, the number of the serial resonators 65 may be made one as well. Each parallel arm 63 has a parallel resonator 67 which connects the input side (here, the transmission terminal 53T side) or output side (here, the antenna terminal 53A side) of any serial resonator 65 and the GND terminal 53G (p1 to p3 in FIG. 2). The plurality of parallel arms 63 (parallel resonators 67) are connected to the positions which are electrically different from each other relative to the serial arm 61 (positions having mutually different relative relationships relative to the serial resonator 65).

In the present embodiment, the initial stage resonator in the ladder-type filter 55 (the side closest to the input (transmission terminal 53T side)) becomes a serial resonator 65 (first serial resonator 65A). That is, a parallel resonator 67 connected to the transmission terminal 53T side with respect to the first serial resonator 65A (from another viewpoint, all serial resonators 65) is not provided. Note that, unlike the illustration, in the case where a parallel resonator 67 connected to the transmission terminal 53T side of the first serial resonator 65A is provided, the initial stage resonator is a parallel resonator 67. The last stage resonator (antenna terminal 53A side) may be a serial resonator 65 (example shown) or may be a parallel resonator 67.

Note that, in the SAW filter 51, which of the two terminals (53T and 53A) provided for input and output is the transmission terminal 53T or antenna terminal 53A (from another viewpoint, the direction in which the signal to be made to pass is propagated) can be determined from for example the specifications of the SAW filter 51.

Each of the serial resonators 65 and parallel resonators 67 is for example configured by a SAW resonator 1 explained with reference to FIG. 3. However, the specific values of the number of electrode fingers 15, the length and/or pitch "p" of the electrode fingers 15, etc. are set in accordance with the characteristics demanded from each resonator.

Each of the serial resonators 65 and parallel resonators 67 may be configured by one SAW resonator 1 or may be configured by a plurality of SAW resonators 1. In the example shown, the third parallel resonator 67C is configured by one SAW resonator 1, and the other resonators are configured by pluralities of SAW resonators 1 (69).

Note that, the resonators other than the third parallel resonator 67C may be grasped as configured by single SAW resonators 1 divided into pluralities of SAW resonators 1 as well. In the following description, when one serial resonator 67 or one parallel resonator 67 is configured by a plurality of SAW resonators 1, these SAW resonators 1 will be referred to as "divided resonators 69".

In each of the serial resonators 65 or parallel resonators 67, the plurality of divided resonators 69 are connected in series to each other. The connection may be made by the wirings 59 or may be made by sharing the bus bars 13.

Note that, when there are a plurality of serially connected SAW resonators 1 in the serial arm 61, for example, whether each SAW resonator 1 is a divided resonator 69 or is one solely configuring a serial resonator 65 may be determined based on the connection position with the parallel arm 63. For example, unless the parallel arm 63 is connected between two mutually serially connected SAW resonators 1, those two SAW resonators 1 are divided resonators 69 configuring one serial resonator 65 together.

Note that, although not particularly shown, a capacitor which is connected in parallel to the serial resonator 65 or parallel resonator 67 or an inductor which is connected in series between the parallel resonator 67 and the GND terminal 53G may be provided as well.

In FIG. 4, the wirings 59 are connected to only portions of the bus bars 13 in the D1 axis direction (see FIG. 1). However, the wirings 59 may also be connected to the bus bars 13 in the serial resonators 65 or parallel resonators 67 over substantially the entireties in the D1 axis direction thereof. From another viewpoint, the boundaries between the wirings 59 and the bus bars 13 need not be clear.

(Configuration of Additional Resonator)

Next, the configuration of the additional resonator 57 realizing the capacitor part 85 shown in FIG. 2 will be explained. The additional resonator 57 is connected to the transmission terminal 53T at the front stage (input side) from the ladder-type filter 55 (from another viewpoint, the initial stage resonator of the first serial resonator 65A) and is connected to the GND terminal 53G-1. Accordingly, for example, a heat discharge route is formed from the transmission terminal 53T to the GND terminal 53G-1, and the ladder-type filter 55 is protected from heat. Note that, the additional resonator 57 appears like a parallel resonator 67 in the ladder-type filter 55 if viewing only the connection relationships thereof. However, its resonance frequency and antiresonance frequency are much different from those in the parallel resonator 67, therefore it does not directly contribute to the configuration of the passing band of the ladder-type filter. Specifically, a resonance frequency out of the passing band of the ladder-type filter is provided.

The additional resonator 57 only have to be electrically connected to the transmission terminal 53T at the front stage from the ladder-type filter 55. The connection position on the piezoelectric substrate 3 when viewed in a plane (connection position from structural viewpoint) may be suitably set. For example, when provision is made of an wiring 59 which appears to extend from the additional resonator 57, this wiring 59 may be connected to any of a wiring 59 connecting the transmission filter 55 and the transmission terminal 53T, the bus bar 13 on the front stage side of the first serial resonator 65A, and the transmission terminal 53T as well.

The additional resonator 57, for example, as schematically shown in FIG. 4, is configured by an interdigital capacitor, that is, an IDT electrode 7. In other words, the additional resonator 57 is configured as the SAW resonator 1 from which the pair of reflectors 9 are removed. Since the pair of reflectors 9 are not provided, in the additional resonator 57, for example, the function as a resonator falls. As a result, the significance as the capacity element becomes relatively larger. However, the additional resonator 57 may have a pair of reflectors 9 as well. Further, a solid pattern conductor may be arranged on the two sides in the direction of propagation of the SAW of the additional resonator 57 so as to reduce leakage of the SAW from the additional resonator 57. Further, the additional resonator 57 may be configured as the IDT electrode 7 from which the dummy electrodes 17 are removed as well. In this way, since the reflectors 9 and dummy electrodes 17 are not provided, the additional resonator 57 can be made much smaller compared with the size required by the other SAW resonators 1 so as to obtain the same capacity. Further, the additional resonator 57 is configured so as to run along the direction of propagation of the SAW in this example. However, it may be configured with an inclination toward a crossing direction as well.

The relative positions on the piezoelectric substrate 3 of the additional resonator 57 (its IDT electrode 7), transmission terminal 53T, and GND terminal 53G-1 and the shapes of the wirings connecting them may be suitably set. For example, they may be positioned on the outermost side in the D1 direction compared with the other resonators 1. They may be positioned so as not to overlap the other resonator 1 when viewed in the D2 direction as well. Further, as shown in FIG. 4, they may be arranged at intervals from the other resonators (65, 67) as well. In other words, they may be arranged so as to contact a region where no conductor patterns are formed so as to be separated from the other resonators (65, 67) and conductor patterns connecting them. The capacity of the additional resonator 57 must be precisely realized. With respect to this, by employing such an arrangement, unwanted parasitic capacitance can be suppressed.

The GND terminal 53G-1 connected with the additional resonator 57 is also connected with the first parallel resonator 67A.

The terminals 53, wirings 59, the electrodes in the serial resonators 65, the electrodes in the parallel resonators 67, and the electrodes in the additional resonator 57 are for example configured by mutually the same conductor layers (mutually the same materials and thicknesses). However, they may be configured by mutually different materials, or only a portion among them may have another conductor layer formed on the conductor layer common to them.

Here, the additional resonator 57 is configured by the IDT electrode 7. Therefore, in the same way as the SAW resonator 1, it has a resonance frequency fcr and antiresonance frequency fca. However, both of those resonance frequency fcr and antiresonance frequency fca are positioned outside of the passing band PB of the ladder-type filter 55. From another viewpoint, although the additional resonator 57 is the same in connection relationships as the parallel resonator 67, it need not have frequency characteristics capable of configuring the ladder-type filter 55 in the relationships with the frequency characteristics of the serial resonators 65 and other parallel resonators 67.

The additional resonator 57 functions as the capacitor part 85. The pitch, intersecting width, line width, and number of the electrode fingers 15 are determined so as to realize the desired parasitic capacitance. As one example, the pitch may be made larger and the line width may be made broader than the serial resonators 85 and parallel resonators 87.

Note that, FIG. 4 does not include the configuration for realizing the inductor part 87 shown in FIG. 2. However, as will be explained later, it may be formed on a circuit board on which the piezoelectric substrate 3 will be mounted through the terminals 53, a package member for packaging the SAW resonator 1, or the like by conductor patterns and connected through the terminals 53 circuit-wise.

(Packaged SAW Filter)

The SAW filter 51 may be for example utilized as it is (as a bare chip as it is) by being assembled into an electronic apparatus or the like. However, the SAW filter 51 may be packaged as well. In the following description, an example of a package will be shown.

Example 1 of Package

Figure 5:
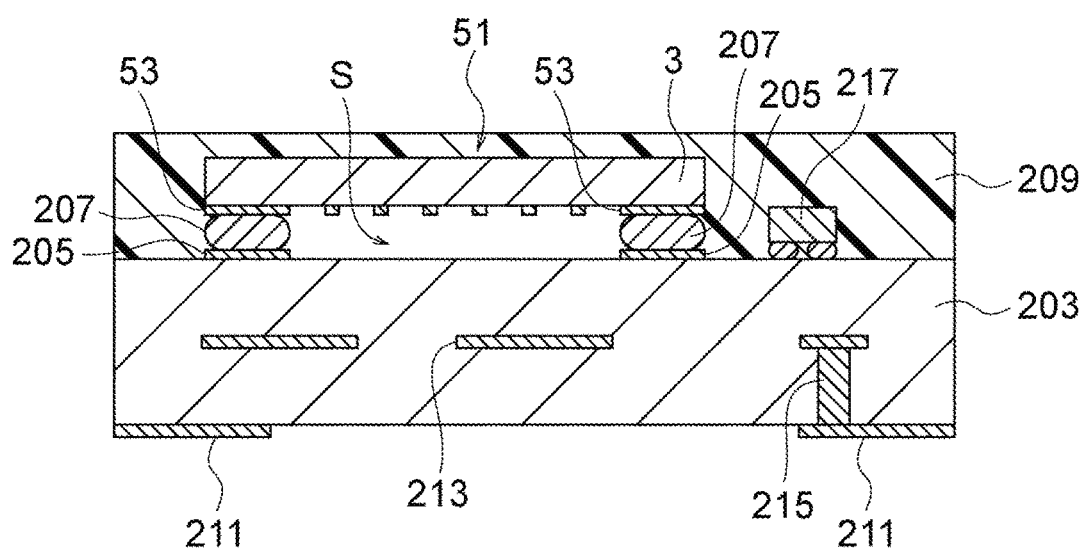
FIG. 5 is a cross-sectional view showing an example of the SAW filter configured by packaging.

FIG. 5 is a cross-sectional view showing a SAW filter 51 configured by packaging.

In the SAW filter 51, the piezoelectric substrate 3 is arranged so as to face a facing substrate 203 through a clearance. Further, the terminals 53 and the pads 205 of the facing substrate 203 are bonded by bumps 207 interposed therebetween. Due to this, a vibration space S facilitating the propagation of the SAW (vibration of the piezoelectric substrate 3) is configured above the transmission filter 55. The vibration space S is sealed by a sealing part 209 made of resin or the like arranged on the periphery of the SAW filter 51 above the facing substrate 203.

In the facing substrate 203, external terminals 211 for mounting the SAW filter 201 on a circuit board or the like by bumps are provided on the surface on the opposite side to the surface on which the SAW filter 51 is mounted. The pads 205 and the external terminals 211 are electrically connected by wiring conductors (notation is omitted) of the facing substrate 203. The wiring conductors are for example configured by layer-shaped conductor patterns 213 formed along the facing substrate 203 in an internal portion or on the surface of the facing substrate 203 (its insulation substrate) and via conductors 215 penetrating through the facing substrate 203 in the thickness direction thereof. For example, the inductor part 87 and inductors L1 to L3 shown in FIG. 2 may be configured by forming conductor patterns 213 in suitable planar shapes as well.

In the SAW filter 51, an electronic device other than the ladder-type filter 55 may be provided as well. Further, for example, an electronic device (for example an electronic component 217) may be mounted on the facing substrate 203 as well. The electronic component 217 is for example a chip-shaped component. Further, for example, it is an inductor or IC (integrated circuit).

Example 2 of Package

Figure 6:
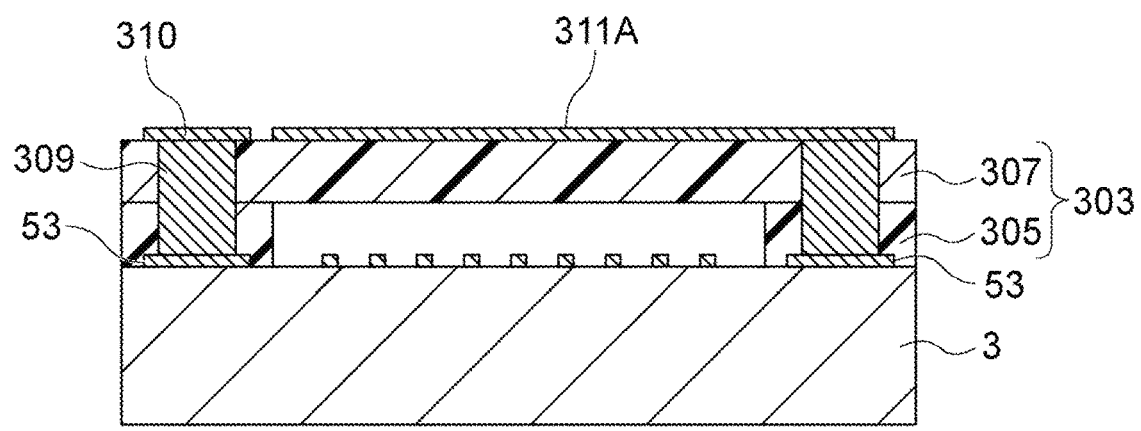
FIG. 6 is a cross-sectional view showing an example of the SAW filter configured by packaging.

FIG. 6 is a cross-sectional view showing a SAW filter 51 configured by packaging the ladder-type filter 55 by another technique.

In this example, a cover 303 is provided above the piezoelectric substrate 3. The cover 303 has a frame 305 surrounding at least the ladder-type filter 55 above the piezoelectric substrate 3 and a lid 307 which is positioned on the frame 305 and closes an opening of the frame 305. Due to this, the vibration space S facilitating the propagation of SAW (vibration of the piezoelectric substrate 3) is configured above the transmission filter 55. In a case of a configuration where the piezoelectric substrate 3 is bonded to a support substrate, the frame 305 may be arranged above the support substrate as well. Note that, when viewed on a plane, the additional resonator 57 may be positioned in the frame 305 or may be superimposed on the frame 305 (it will be explained later).

On the terminals 53, columnar terminals 309 penetrating through the cover 303 are provided. The upper surface side portions of the columnar terminals 309 become lands 310 for mounting the SAW filter 301 on a circuit board etc. by bumps. Note that, through holes penetrating through the cover 303 may be provided on the terminals 53 without the columnar terminals 309. In this case, for example, the terminals 53 and the circuit board or the like are bonded by bumps.

As shown in FIG. 6, on the upper surface of the cover 303, a reinforcing layer 311 which overlaps at least a portion of the vibration space S when viewed on a plane is provided. The reinforcing layer 311 is for example configured by a metal or other conductor having a higher stiffness than that of the cover 303. The reinforcing layer 311 for example contributes to suppression of warping of the lid 307 toward the vibration space S side.

Here, the reinforcing layer 311 functions as the inductor part 87 or inductor L shown in FIG. 2 as a linear pattern having a narrow width. Due to this, the inductor part 87 can be provided on the cover 303.

Note that, there are a plurality of reinforcing layers 311. One which is not connected with a land 310 may be included, or one which does not function as an inductor part 87 may be included.

(Coating of Additional Resonator)

The additional resonator 57 may be covered by an insulator or the like which does not cover the ladder-type filter 55 (its resonators) as well. In this case, for example, the propagation of the SAW (vibration of the piezoelectric substrate 3) in (the resonators of) the ladder-type filter 55 is permitted, while propagation of the SAW in the additional resonator 57 can be suppressed. In the following description, an example of such an insulator will be shown.

Figure 7A:
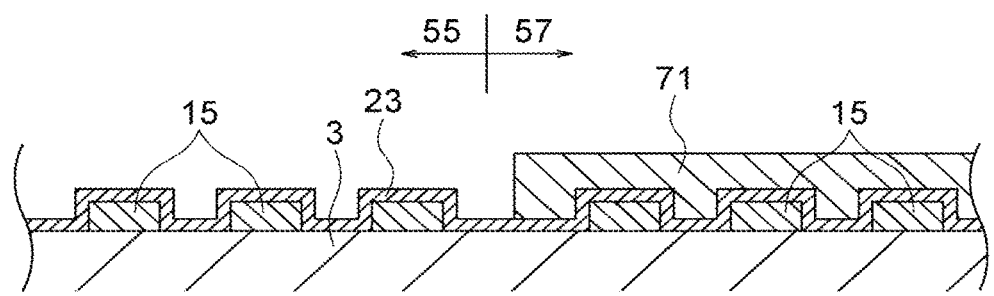
FIGS. 7A to 7C are views respectively showing examples of an insulator covering an additional resonator.

FIG. 7A is a cross-sectional view schematically showing a portion of an example of the configuration on the upper surface of the piezoelectric substrate 3.

The upper surface of the piezoelectric substrate 3 is covered by a protective film 23 from the tops of the conductor layers configuring the IDT electrodes 7 etc. The protective film 23 may be one for only suppressing corrosion of the IDT electrodes 7 etc. Otherwise, it may be one contributing to temperature compensation. The protective film 23 is for example comprised of $SiO_2$. Further, the thickness thereof may be thinner than the IDT electrode 7 etc. (example shown) or may be thicker than the latter. The protective film 23 for example covers both of the transmission filter 55 and additional resonator 57.

The additional resonator 57 is covered by an insulation layer 71 which is not provided on the transmission filter 55 (serial resonators 65 and parallel resonators 67). The insulation layer 71 is for example made of resin or an inorganic material. The thickness thereof may be suitably set. Note that, the insulation layer 71 may directly cover the additional resonator 57 without interposition of the protective film 23 as well.

Figure 7B:
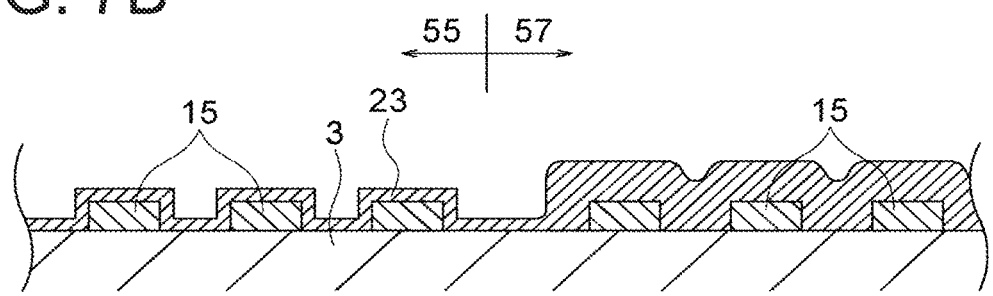

FIG. 7B is a cross-sectional view schematically showing a portion of another example of the configuration on the upper surface of the piezoelectric substrate 3.

In this example, the protective film 23 which was explained with reference to FIG. 7A becomes thicker in the thickness on the additional resonator 57 than the thickness on the transmission filter 55 (serial resonators 65 and parallel resonators 67). Such a configuration is for example realized by performing a process of film formation of a material forming the protective film 23 on the entire surface of the piezoelectric substrate 3 and a process of film formation of a material forming the protective film 23 only on the additional resonator 57. Note that, either of the two processes may be first.

Figure 7C:
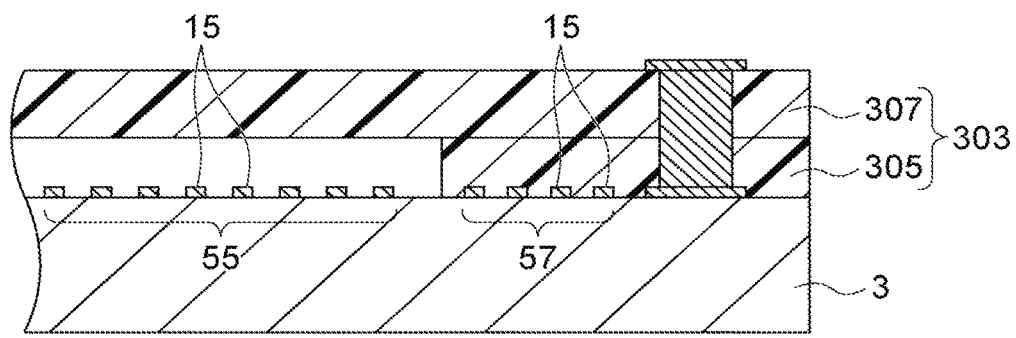

FIG. 7C is a cross-sectional view schematically showing a portion of still another example of the configuration on the upper surface of the piezoelectric substrate 3.

In this example, provision of the cover 303 explained with reference to FIG. 6 is assumed. Further, the frame 305 in the cover 303 surrounds the transmission filter 55 when viewed on a plane and is positioned on the additional resonator 57. That is, the frame 305 functions as an insulator which covers only the additional resonator 57 between the transmission filter 55 (its resonators) and the additional resonator 57. Note that, the protective film 23 is not shown in FIG. 7C. However, the cover 303 may be provided on the protective film 23 as well.

As explained above, the capacitor part 85 and the inductor part 87 can be realized together with the package. By employing such a configuration, the capacitor part 85 can be formed as a fine electrode pattern on the piezoelectric substrate 3. As a result, a fine capacity value can be realized. On the other hand, by providing the inductor part 87 in the package part or mounting substrate, a desired inductance can be realized without increasing the size.

Further, unlike the example shown, the inductor part 87 etc. may be configured according to the conductor patterns on the piezoelectric substrate 3 as well.

(Multiplexer)

Figure 8:
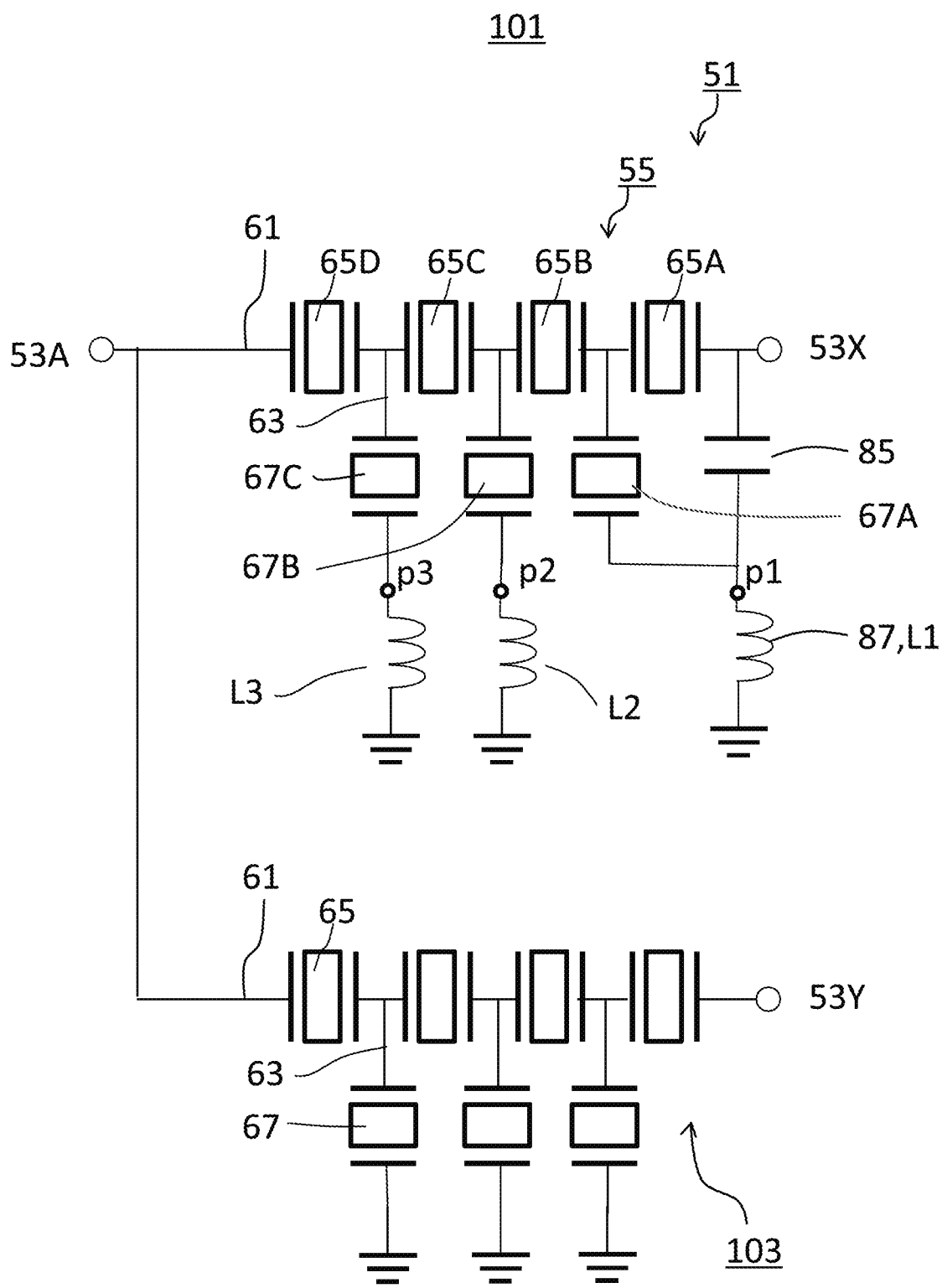
FIG. 8 is a view schematically showing a multiplexer as an example of utilization of the SAW filter in FIG. 4.

FIG. 8 is a view schematically showing a multiplexer 101 as an example of utilization of the SAW filter 51.

The multiplexer 101 is for example a duplexer which splits a transmission signal and a reception signal. In this operation, use is made of the SAW filter 51 as the filter filtering the transmission signal.

The multiplexer 101 for example has the SAW filter 51, a second signal terminal 53Y, and a passband filter (receiving filter in this example) 103 which is positioned between the antenna terminal 53A and the second signal terminal 53Y (reception terminal 53R in this example).

The configuration of the receiving filter 103 may be a suitable one. In FIG. 8, as the receiving filter 103, in the same way as the transmission filter 55, one configured by a ladder-type SAW filter is illustrated. Note that, the SAW filter configuring the receiving filter 103 may have another form (for example multiplex mode type filter) as well.

In the case where the receiving filter 103 is configured by the SAW filter in this way, the ladder-type filter 55 and the receiving filter 103 may be provided on the same piezoelectric substrate 3 or may be provided on piezoelectric substrates 3 which are different from each other. Note that, when they are provided on the same piezoelectric substrate 3, for example, the antenna terminal 53A is common to the ladder-type filter 55 and the receiving filter 103, and the receiving filter 103 is connected to the antenna terminal 53A on the piezoelectric substrate 3. When they are provided on mutually different piezoelectric substrates 3, the antenna terminal 53A is for example one dedicated only to the ladder-type filter 55 between the ladder-type filter 55 and the receiving filter 103. It is not positioned on the shortest route between the antenna and the receiving filter 103. However, the antenna terminal 53A and the receiving filter 103 are still connected as they are through a circuit board or the like on which the SAW filter 55 and the receiving filter 103 are mounted.

Although not particularly shown, the multiplexer 101 may have a configuration other than that described above.

(Communication Apparatus)

Figure 9:
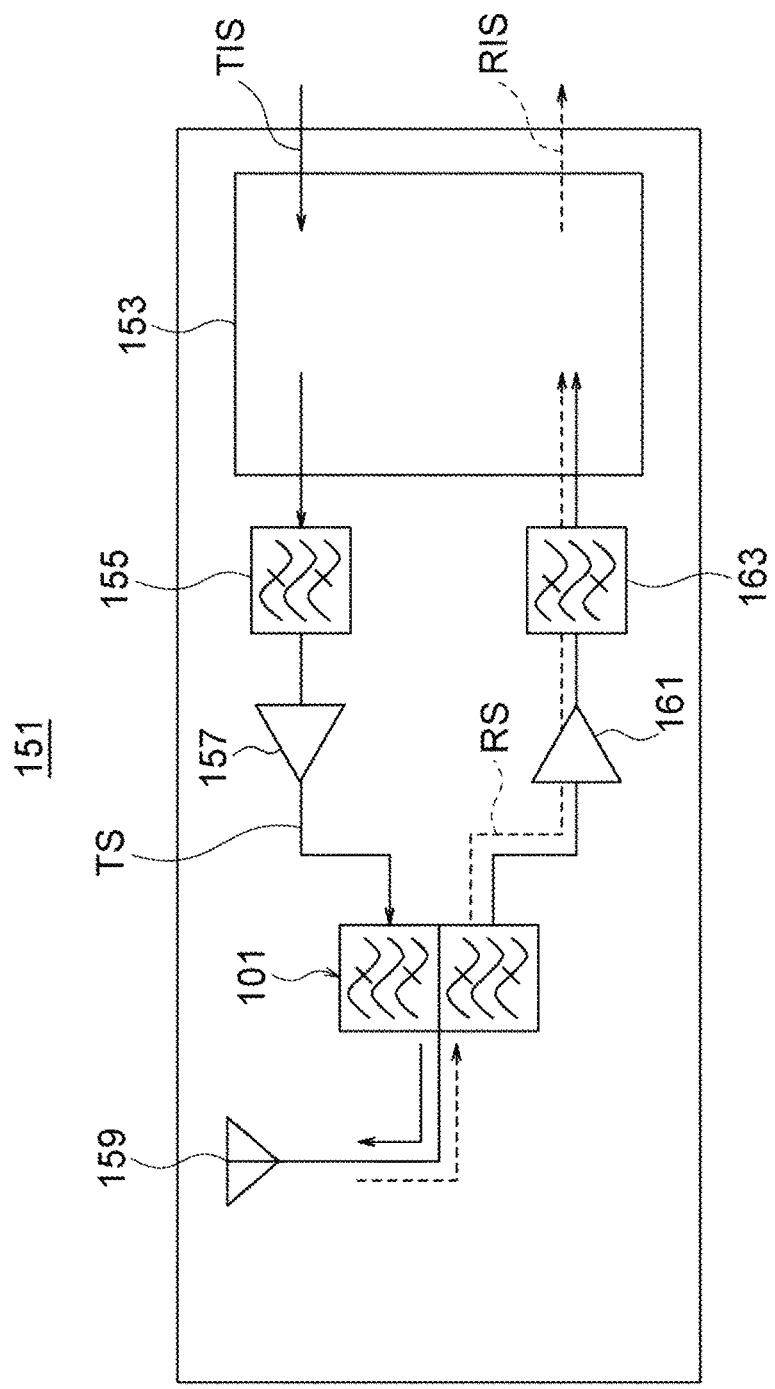
FIG. 9 is a block diagram showing a configuration of a principal part of a communication apparatus as an example of utilization of the multiplexer in FIG. 8.

FIG. 9 is a block diagram showing the configuration of the principal part of a communication apparatus 151 as an example of utilization of the multiplexer 101.

In the communication apparatus 151, a transmission information signal TIS including information to be transmitted is modulated and raised in frequency (converted to a high frequency signal having a carrier frequency) by an RF-IC (radio frequency integrated circuit) 153 to become the transmission signal TS. The transmission signal TS is stripped of unwanted components other than the transmission-use passing band by a band pass filter 155, is amplified by an amplifier 157, and is input to the multiplexer 101 (transmission terminal 53T). Further, the multiplexer 101 strips the unwanted components other than the transmission-use passing band from the input transmission signal TS and outputs the transmission signal TS after stripping from the antenna terminal 53A to an antenna 159. The antenna 159 converts the input electrical signal (transmission signal TS) to a wireless signal (radio wave) and transmits the result.

Further, in the communication apparatus 151, a wireless signal (radio wave) received by the antenna 159 is converted to an electrical signal (reception signal RS) by the antenna 159 and is input to the multiplexer 101 (for example antenna terminal 53A). The multiplexer 101 strips unwanted components other than the reception-use passing band from the input reception signal RS and outputs the result from the reception terminal 53R to an amplifier 161. The output reception signal RS is amplified by the amplifier 161 and is stripped of unwanted components other than the reception-use passing band by a band pass filter 163. Further, the reception signal RS is boosted down in frequency and demodulated by the RF-IC 153 to become the reception information signal RIS.

Note that, the transmission information signal TIS and reception information signal RIS may be low frequency signals (baseband signals) containing suitable information. For example, they are analog audio signals or digital audio signals. The passing band of the radio signal may be ones according to various types of standards such as the UMTS (Universal Mobile Telecommunications System). The modulation scheme may be phase modulation, amplitude modulation, frequency modulation, or a combination of any two or more among them. As the circuit system, FIG. 9 illustrated a direct conversion system. However, a suitable system other than that may be employed. For example, it may be a double superheterodyne system as well. Further, FIG. 9 is one schematically showing only the principal parts. A low pass filter or isolator etc. may be added to suitable positions. Further, the positions of the amplifier etc. may be changed as well.

Although not particularly shown, a multiplexer (diplexer etc.) may be configured by two or more SAW filters 51 having passing bands different from each other being connected to a common antenna-use port (the port may be antenna terminal 53A as well), or by two or more multiplexers 101 having mutually different passing bands being connected to a common antenna-use port or the like. Further, a communication module may be configured by mounting suitable electronic parts on a circuit board on which the SAW filter 51, 201, or 301 is mounted.

The technique in the present disclosure is not limited to the above embodiment and may be executed in various ways.

The acoustic wave is not limited to a SAW. For example, the acoustic wave may be a bulk wave propagating in the piezoelectric substrate or may be an acoustic boundary wave propagating through a boundary part between the piezoelectric substrate and the insulation layer covering the piezoelectric substrate (however, it is one type of SAW in a broad sense).

The direction of arrangement of a plurality of electrode fingers in the additional resonator need not always coincide with the direction of propagation of the SAW either.

The conductor pattern which configures the inductor and is provided in the package-use member is not limited to one provided in the internal portion of the facing substrate 203 or cover 303. For example, the conductor pattern may be provided on the surface of the facing substrate or cover as well. Further, the electronic part which configures the inductor or capacitor and is mounted on the package-use member is not limited to one mounted on the facing substrate 203. For example, the electronic part may be mounted on the upper surface of the cover 303 as well. Further, the electronic part may be positioned in the internal portion of the package-use member. For example, it may be arranged in a recessed part formed in a circuit board or cover.

EXAMPLES

Figure 10A:
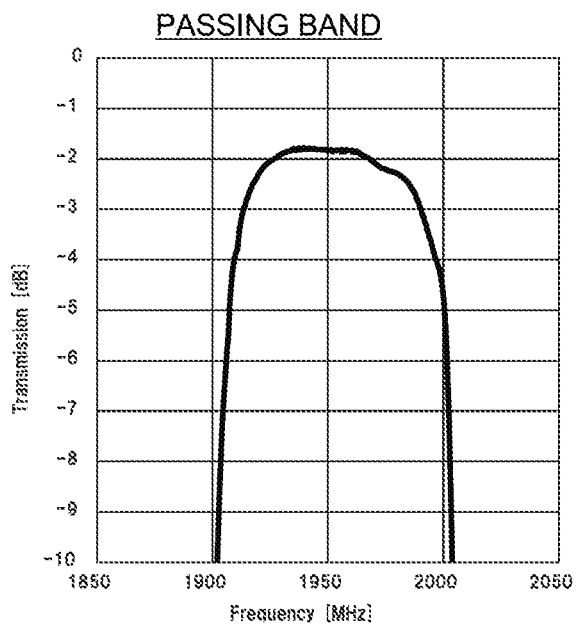
FIG. 10A is a graph showing transmission characteristics in passing bands of multiplexers according to Example 1 and Comparative Example 1.
Figure 10C:
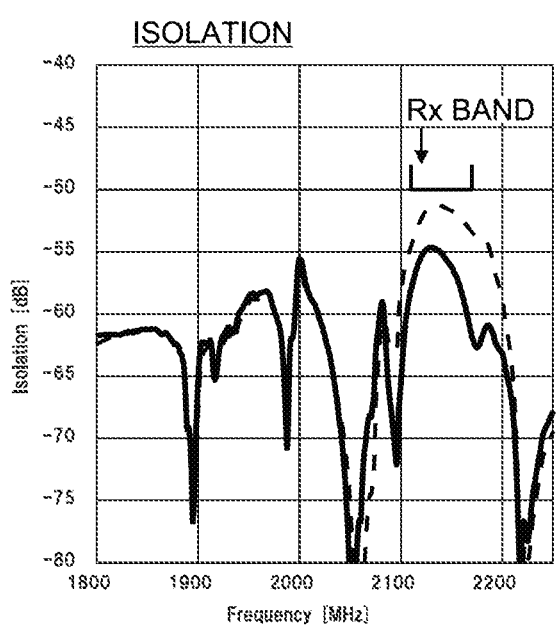
FIG. 10C is a graph showing isolation characteristics of the multiplexers according to Example 1 and Comparative Example 1.
Figure 10B:
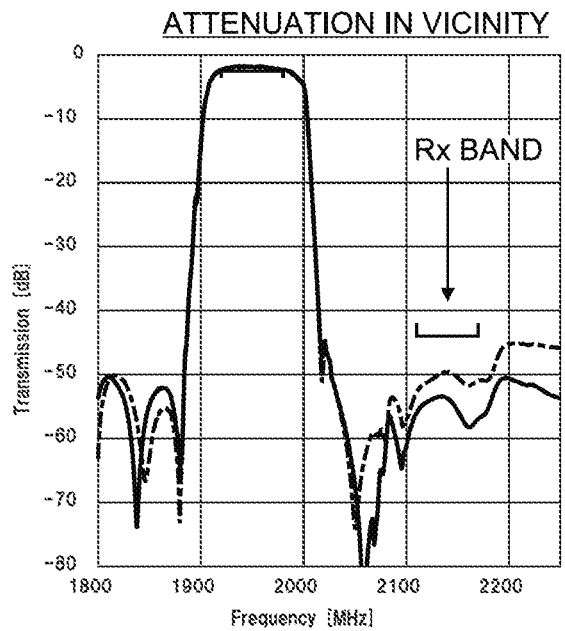
FIG. 10B is a graph showing the transmission characteristics in the vicinity of the passing bands of the multiplexers according to Example 1 and Comparative Example 1.
Figure 11A:
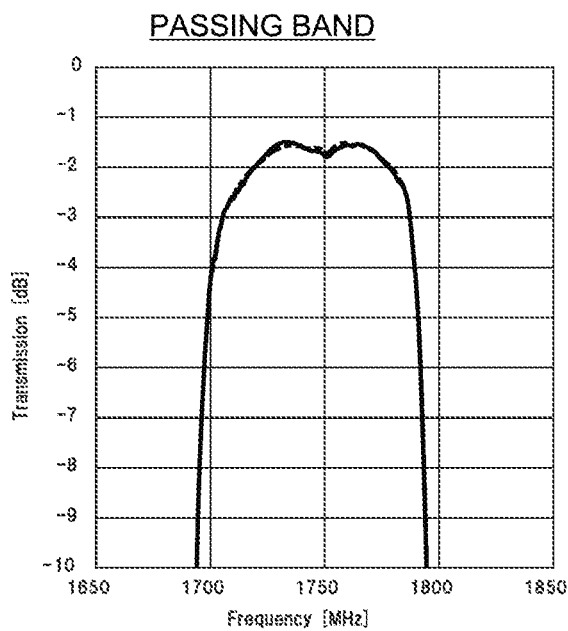
FIG. 11A is a graph showing the transmission characteristics in passing bands of multiplexers according to Example 2 and Comparative Example 2.
Figure 11C:
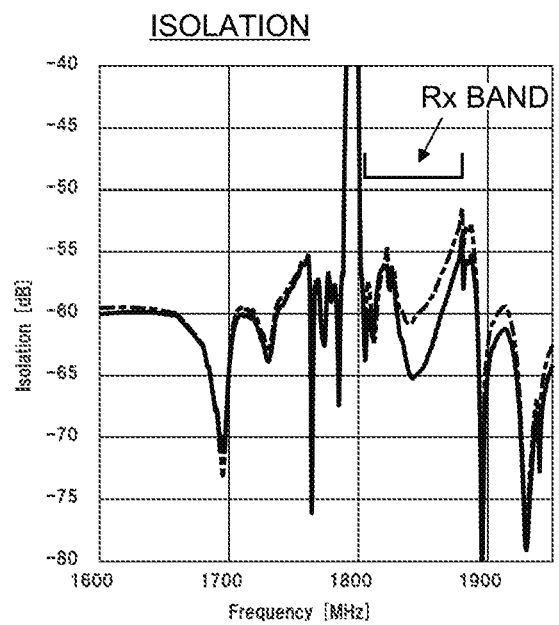
FIG. 11C is a graph showing the isolation characteristics of the multiplexers according to Example 2 and Comparative Example 2.
Figure 11B:
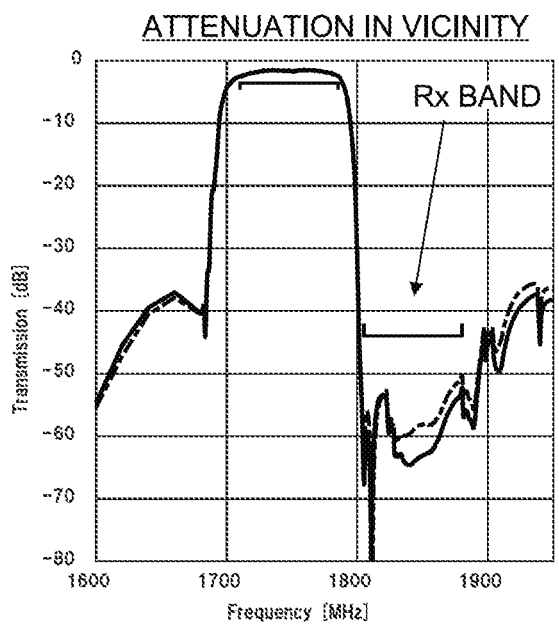
FIG. 11B is a graph showing the transmission characteristics in the vicinity of the passing bands of the multiplexers according to Example 2 and Comparative Example 2.

FIGS. 10 and FIGS. 11 show the results of frequency characteristics at the time when multiplexers each having the receiving filter and the transmission filter connected to a common antenna terminal are formed for two bands. FIG. 10A and FIG. 11A show the transmission characteristics of the passing band, FIG. 10B and FIG. 11B show the transmission characteristics in the vicinity of the passing band (high frequency side), and FIG. 10C and FIG. 11C show isolation characteristics.

In any band, cases where the capacitor part 85 and inductor part 87 as shown in FIG. 2 were provided in the filter having the passing band positioned on a low frequency side were defined as Examples 1 and 2 and were indicated by solid lines. Further, ones having exactly the same configurations as those in the examples except that the capacitor part 85 and inductor part 87 were not provided were defined as Comparative Examples 1 and 2 and were indicated by broken lines.

In Example 1 shown in FIGS. 10, the static capacitance of the capacitor part 87 was set to approximately 0.2 pF, and the inductance of the inductor part was set to approximately 1.5 nH.

In Example 2 shown in FIGS. 11, the static capacitance of the capacitor part 87 was set to approximately 0.2 pF, and the inductance of the inductor part was set to approximately 2 nH.

In all of the examples, it is confirmed that the there is no deterioration of characteristics in the passing band due to the capacitor part 85 and inductor part 87. Further, it was confirmed that the attenuation characteristics out of the passing band in the examples were improved compared with the comparative examples and also that the isolation characteristics were improved compared with the comparative examples along with that. Further, the capacity of the capacitor part 85 is very small and causes a great change in the resonance frequency even if fluctuation of the capacitance value is very small. For this reason, it becomes necessary for the capacitor part 85 to adjust the capacity in units of 0.01 pF. Therefore, as shown in FIG. 4, an interdigital type capacitor is the optimum.

Figure 12A:
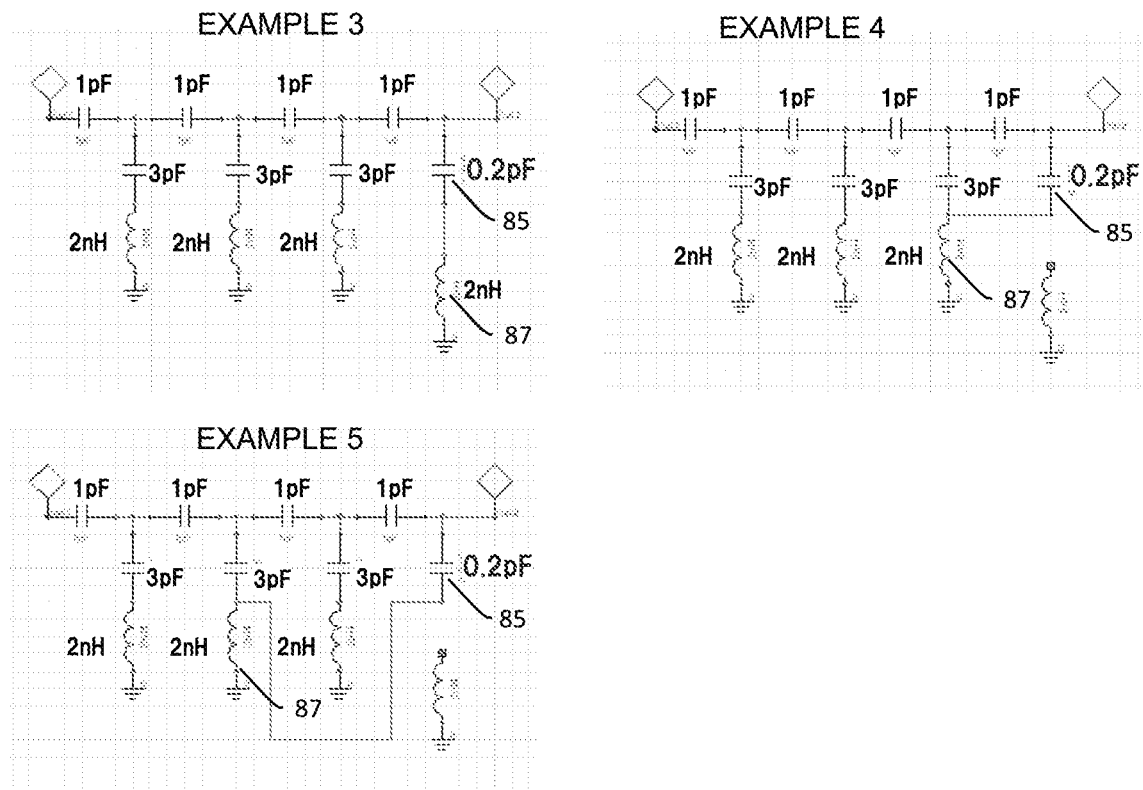
FIGS. 12A are circuit diagrams of SAW filters according to Examples 3 to 5.
Figure 12B:
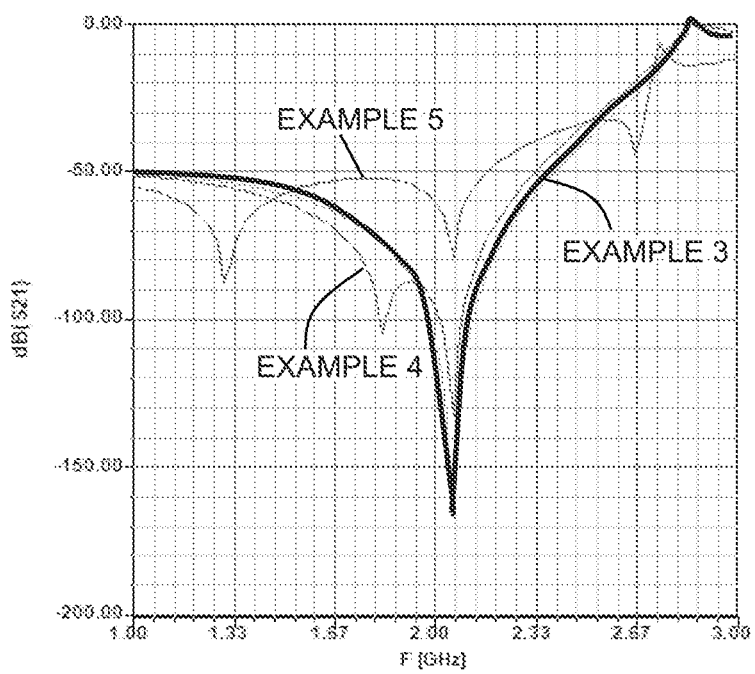
FIG. 12B is a graph showing resonance characteristics caused by capacitor parts and inductor parts in the SAW filters according to Examples 3 to 5.

Further, as Examples 3 to 5, the connection method of the capacitor part 85 and the inductor part 87 was made different. The frequency characteristics of the LC serial resonance circuit part in that case were simulated. FIGS. 12A shows circuit diagrams of Examples 3 to 5, while FIG. 12B shows the frequency characteristics of the serial resonance circuit part. In a case where the parallel resonator 67 is not connected with the capacitor part 85 and inductor part 87 circuit wise as shown in Example 3, a large attenuation pole can be formed at one point. Further, when the parallel resonator 67 is connected with the capacitor part 85 and inductor part 87 circuit wise as shown in Example 4 and Example 5, the attenuation amount at the attenuation pole becomes smaller compared with Example 3, but a plurality of attenuation poles can be formed, therefore the attenuation characteristics can be improved over a broad band.

Further, the attenuation amount became larger in Example 4 compared with Example 5. From this fact, the capacitor part 85 may be connected parallel with the initial stage parallel resonator as well.

Note that, the capacitor part 85 is smaller in capacity than all serial resonators 65 and parallel resonators 67. In order to improve the attenuation characteristics, the capacity of the parallel resonator 67 tends to become larger. However, the capacitor part 85 is set to have a capacity not more than $1/10$ compared with the capacity of the parallel resonator 67. The capacitor part 85 is not divided like the divided resonators 69 and does not have reflectors and dummy electrode fingers, therefore it can be controlled to about $1/20$ or less compared with the area required for the parallel resonator 67. For this reason, the SAW filter 51 in the present disclosure becomes one capable of improving the attenuation characteristics without causing an increase of size due to the capacitor part 85.

REFERENCE SIGNS LIST

3... piezoelectric substrate, 7... IDT electrode, 51... SAW filter (acoustic wave filter), 53T... transmission terminal, 53A... antenna terminal, 53G (53G-1 to 53G-3)... GND terminals, 55... ladder-type filter, 57... additional resonator, 65 (65A to 65D)... serial resonators, 67 (67A to 67C)... parallel resonators, 85... capacitor part, and 87... inductor part.

The invention claimed is:

1. An acoustic wave filter comprising:
   a first signal terminal,
   an antenna terminal,
   a ladder-type filter connected between the first signal terminal and the antenna terminal and comprising one or more serial resonators and one or more parallel resonators connected in a ladder shape wherein the ladder-type filter comprises a piezoelectric substrate on which the one or more serial resonators and the one or more parallel resonators are located, and in the ladder-type filter, an initial stage resonator connected to the first signal terminal is a serial resonator,
   a capacitor part and an inductor part which are connected in series between the first signal terminal and a reference potential, wherein at least one of the one or more parallel resonators is electrically connected to a position between the capacitor part and the inductor part, the capacitor part is located on the piezoelectric substrate and is configured by an interdigital capacitor which has a resonance frequency not overlapping a passing band of the ladder-type filter, and
   a facing substrate on which the piezoelectric substrate is mounted so as to face each other, wherein the inductor part is configured by a conductor pattern located in an internal portion of the facing substrate.

2. A multiplexer comprising:
   the acoustic wave filter according to claim 1,
   a second signal terminal, and
   a band filter which is located between the antenna terminal and the second signal terminal and has a passing band different from a passing band of the ladder-type filter.

3. A communication apparatus comprising:
   an antenna,
   the acoustic wave filter according to claim 1 in which the antenna terminal is connected to the antenna, and
   an IC connected to the first signal terminal.

4. The acoustic wave filter according to claim 1, wherein;
   the capacitor part and the inductor part which are connected in series in this order and the capacitor part is electrically closer to the first signal terminal than a reference potential terminal which is connected to a reference potential through the inductor part, and;
   the at least one of the one or more parallel resonators is connected to the reference potential terminal.

5. The acoustic wave filter according to claim 1, further comprising a cover which is located on an upper surface of the piezoelectric substrate and accommodates the ladder-type filter, wherein
   the inductor part is configured by a conductor pattern which is located contacting the cover.

6. The acoustic wave filter according to claim 1, wherein a capacity of the capacitor part is $1/5$ or less of a capacity of a resonator having the smallest static capacitance among the one or more serial resonators and the one or more parallel resonators.

7. The acoustic wave filter according to claim 1, further comprising an insulator,
   which covers only the capacitor part among the one or more serial resonators, the one or more parallel resonators, and the capacitor part, or
   which is thicker only on the capacitor part among the one or more serial resonators, the one or more parallel resonators, and the capacitor part.

8. An acoustic wave filter comprising:
   a first signal terminal,
   an antenna terminal,
   a ladder-type filter connected between the first signal terminal and the antenna terminal and comprising one or more serial resonators and one or more parallel resonators connected in a ladder shape, and
   a capacitor part and an inductor part which are connected in series between the first signal terminal and a reference potential, wherein
   the ladder-type filter comprises a piezoelectric substrate on which the one or more serial resonators and the one or more parallel resonators are located,
   in the ladder-type filter, an initial stage resonator connected to the first signal terminal is a serial resonator,
   the capacitor part is located on the piezoelectric substrate and is configured by an interdigital capacitor which has a resonance frequency not overlapping a passing band of the ladder-type filter, and
   a facing substrate on which the piezoelectric substrate is mounted so as to face each other, wherein the inductor part is configured by a conductor pattern located in an internal portion of the facing substrate.

9. The acoustic wave filter according to claim 8, wherein a capacity of the capacitor part is $1/5$ or less of a capacity of a resonator having the smallest static capacitance among the one or more serial resonators and the one or more parallel resonators.

10. The acoustic wave filter according to claim 8, further comprising an insulator,
    which covers only the capacitor part among the one or more serial resonators, the one or more parallel resonators, and the capacitor part, or
    which is thicker only on the capacitor part among the one or more serial resonators, the one or more parallel resonators, and the capacitor part.

11. A multiplexer comprising:
the acoustic wave filter according to claim 8,
a second signal terminal, and
a band filter which is located between the antenna terminal and the second signal terminal and has a passing band different from a passing band of the ladder-type filter.

12. A communication apparatus comprising:
an antenna,
the acoustic wave filter according to claim 8 in which the antenna terminal is connected to the antenna, and
an IC connected to the first signal terminal.

13. The acoustic wave filter according to claim 8, further comprising a cover which is located on an upper surface of the piezoelectric substrate and accommodates the ladder-type filter, wherein
the inductor part is configured by a conductor pattern which is located contacting the cover.

14. An acoustic wave filter comprising:
a first signal terminal,
an antenna terminal,
a ladder-type filter connected between the first signal terminal and the antenna terminal and comprising one or more serial resonators and one or more parallel resonators connected in a ladder shape, and
a capacitor part and an inductor part which are connected in series between the first signal terminal and a reference potential, wherein a capacity of the capacitor part is ⅕ or less of a capacity of a resonator having the smallest static capacitance among the one or more serial resonators and the one or more parallel resonators.

15. The acoustic wave filter according to claim 14, further comprising an insulator,
which covers only the capacitor part among the one or more serial resonators, the one or more parallel resonators, and the capacitor part, or
which is thicker only on the capacitor part among the one or more serial resonators, the one or more parallel resonators, and the capacitor part.

16. A multiplexer comprising:
the acoustic wave filter according to claim 14,
a second signal terminal, and
a band filter which is located between the antenna terminal and the second signal terminal and has a passing band different from a passing band of the ladder-type filter.

17. A communication apparatus comprising:
an antenna,
the acoustic wave filter according to claim 14 in which the antenna terminal is connected to the antenna, and
an IC connected to the first signal terminal.

* * * * *